(12) United States Patent
Ichihara

(10) Patent No.: US 6,480,063 B2
(45) Date of Patent: Nov. 12, 2002

(54) METHOD AND CIRCUIT FOR CONTROLLING BASEBAND GAIN

(75) Inventor: Masaki Ichihara, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/950,751

(22) Filed: Sep. 13, 2001

(65) Prior Publication Data

US 2002/0047744 A1 Apr. 25, 2002

(30) Foreign Application Priority Data

Sep. 13, 2000 (JP) ........................................ 2000-278334

(51) Int. Cl.[7] ................................................. H03G 5/16
(52) U.S. Cl. ..................................... 330/133; 455/241.1
(58) Field of Search ................................. 330/129, 130, 330/131, 133, 134, 135; 455/241.1, 251.1, 253.2

(56) References Cited

U.S. PATENT DOCUMENTS 5,483,691 A * 1/1996 Heck et al. ............... 455/241.1
6,107,878 A * 8/2000 Black ......................... 330/133
6,304,139 B1 * 10/2001 Kanno ........................ 330/133
6,353,364 B1 * 3/2002 Klemmer .................... 330/129

FOREIGN PATENT DOCUMENTS

JP          9-135131       5/1997
JP          11-345054      12/1999

* cited by examiner

Primary Examiner—Tuan T. Lam
(74) Attorney, Agent, or Firm—Young & Thompson

(57) ABSTRACT

An object of the present invention is to suppress the generation of a transient voltage in the settings of gains of a plurality of variable gain amplifiers of a baseband circuit. A gain converting circuit provides a limiting value to the quantity of the change of a gain which can be changed once. If gain input data has large change and the gain change exceeding the limiting value is carried out, the quantity of the change is divided into a plurality of quantities of change equal to or lower than the limiting value and variable gain amplifiers are controlled to thereby realize a required gain change. A gain distribution circuit distributes gain control data to the respective variable gain amplifiers on the basis of gain output data of the gain converting circuit.

9 Claims, 10 Drawing Sheets

METHOD AND CIRCUIT FOR CONTROLLING BASEBAND GAIN

BACKGROUND OF THE INVENTION

1. Technical Field of the Invention

The present invention relates to a baseband gain control and particularly to a baseband gain control method and circuit capable of effectively preventing problems derived from a DC offset in the gain control of a direct conversion baseband circuit or the like.

2. Description of the Prior Art

A receiver utilizing direct conversion is advantageous over conventional super-heterodyne type receiver in the following respects and, therefore, expected to be widely used in the future:

1) A high frequency circuit section is simplified and the number of parts such as a filter can be reduced.
2) Since most of the functions including band limitation and AGC (automatic gain control) are executed at a baseband frequency, they can be realized by a CMOS analog circuit suited for LSI.

FIG. 6 is a view showing the concrete constitution of a direct conversion receiver. FIG. 6 shows a baseband gain control system for controlling the gain of a direct conversion baseband circuit, e.g., a system which has a wide dynamic range in the reception signals of a receiver of such a type as W-CDMA (Wide Band Code Division Multiple Access).

A high frequency signal received by an antenna 201 is subjected to band-limitation by a high frequency band-pass filter 202 and a received band is taken out. The signal thus band-limited is amplified by a low noise amplifier LNA 203 and directly inputted into a quadrature demodulator 204. The quadrature demodulator 204 is driven by a local signal generated by a local oscillator 225. The frequency of this local signal is the same as the central frequency of the received high frequency signal.

The quadrature demodulator 204 consists of multiplication circuits 222 and 223 and a phase circuit 224. The balanced outputs of the low noise amplifier LNA 203 are multiplied by the multiplication circuits 222 and 223 through an amplifier 221 in response to the balanced outputs of an orthogonal signal having a phase of 0° and that of 90° of the local signal, respectively, a baseband signal is directly generated from the high frequency signal, and two types of signals, i.e., baseband signals I and Q, are outputted as demodulated outputs. These baseband signals I and Q are subjected to band-limitation by baseband filters 205 and 206, respectively, and then amplified by an AGC circuit 207 so as to have a constant average amplitude.

The dynamic range of the AGC circuit 207 has characteristics of reaching several tens of decibels (about 80 dB for CDMA). The outputs of the AGC circuit 207 are outputted to the next stage as signals 215 and 216, respectively. It is noted that a circuit controlling the gain of this circuit and the algorithm thereof are unrelated to the present invention and, therefore, not described herein.

According to the direct conversion system, channel filters for suppressing adjacent channels are realized not by SAW filters for an IF band but by the baseband filters 205 and 206. Since they can be realized by circuits using active elements, the baseband filters 205 and 206 are suited for an IC. In addition, since the high frequency signal is directly converted into the baseband signals, there is no need to provide a second local oscillator. For these reasons, there is a probability that all the reception circuits from the low noise amplifier LNA 203 to the baseband outputs can be realized by one chip. This greatly contributes to making a cellular phone smaller in size and to the reduction of the number of parts.

Nevertheless, if there is a DC offset, even slightly, in the baseband filters 205 and 206 and the AGC circuit 207, the gain of the AGC sometimes becomes as high as 80 dB and a saturation phenomenon occurs that outputs are fixed to a power supply or the ground. For example, if there exists a DC offset of 1 mV in the bandpass filter 205 and the gain of the AGC circuit 207 is 80 dB, i.e., 10,000 times as high as an input, a DC component of 10 V is outputted. Needless to say, such a voltage is far beyond the voltage of a battery for a cellular phone, with the result that the cellular phone cannot operate.

As stated above, it is the most significant problem with the baseband circuit of the direct conversion circuit to eliminate a DC offset as much as possible.

There have been conventionally used high-pass filters (C-cut) each consisting of a DC cut capacitor or the like and provided between stages of variable gain amplifiers so as to eliminate the DC offset of a baseband circuit.

FIG. 7 is a view showing that the baseband circuit for I or Q shown in FIG. 6 is taken out. The baseband circuit consists of a plurality of gain control amplifiers having C-cut structures. To simplify description, FIG. 7 shows the baseband circuit as a single-end circuit. A baseband filter 101 and variable gain amplifiers 102, 103 and 104 (which amplifiers may be also referred to as "VGA1", "VGA2" and "VGA3", respectively) correspond to the baseband filter 205 (206) and the variable gain amplifiers 208 (211), 209 (212) and 210 (213), respectively.

According to this structure, for the purpose of preventing the propagation of a DC offset and the saturation of a signal due to the propagation thereof, high-pass filters 109 to 111 corresponding to C-cuts are inserted between the input section of the circuit and the VGA 102, the VGA 102 and VGA 103, the VGA 103 and the VGA 104 and the VGA 104 and the output section, respectively. The gains of the VGA1, VGA2 and VGA3 are controlled by gain control data distributed from the gain distribution circuit 112 based on gain data inputted from externally.

As stated above, by inserting the high-pass filters into the baseband circuit in appropriate units of the circuit, the propagation of a direct current is prevented in a static state in which gains have no change. In addition, the saturation of a signal due to the DC offset can be prevented.

However, according to the conventional method for eliminating a DC offset in the baseband circuit of the direct conversion receiver, a transient phenomenon due to the DC offset occurs in a dynamic control state in which gains have great change, which often has an adverse effect on reception characteristics.

Assuming that offset voltages $V_{of1}$, $V_{of2}$ and $V_{of3}$ are added to the input sides of the VGA1, VGA2 and VGA3, respectively, based on the circuit of FIG. 7, it is considered what type of a transient phenomenon occurs to an output if the respective gains $g_1$, $g_2$ and $g_3$ are changed.

It is assumed here that the transfer functions of the high-pass filters 109 to 111 inserted as shown in FIG. 7 are the same and represented by the following expression for brevity.

$$B(s) = \frac{s}{s+\alpha}. \quad (1)$$

It is assumed that the gains of the VGA1, VGA2 and VGA3 (not as dB values but as true values) are $g_1$, $g_2$ and $g_3$, respectively, and that these gains are changed to $g_1'$, $g_2'$ and $g_3'$, respectively. For brevity, the following conditions are set:

a) The gains $g_1$, $g_2$ and $g_3$ are 1 time to 16 times as high as inputs;

b) The gains $g_1$, $g_2$ and $g_3$ are not changed simultaneously; and c) The gains $g_1$, $g_2$ and $g_3$ are changed instantaneously.

1) If the gain of the VGA3 is changed from $g_3$ to $g_3'$:

Since being cut by the high-pass filters 109 and 110, respectively, the offset voltages $V_{of1}$ and $V_{of2}$ have no effect on the output and only the offset voltage $V_{of3}$ has an effect on the output. At the input of the high-pass filter 111, a step-like voltage change $\Delta V_3$ occurs as follows.

$$\Delta V_3 = (g_3' - g_3) \cdot v_{of3} \qquad (2).$$

This step-like change influences an output $V_{out}$ through the high-pass filter 111. A contribution thereof is described using Laplace transform as follows.

$$V_{out(s)} = B(s) \cdot \frac{\Delta V_3}{s} = (g_3' - g_3) \cdot V_{of3} \cdot \frac{1}{s+\alpha}. \qquad (3)$$

Assuming that $g_3$ is changed at t=0, a time response is obtained as follows.

$$V_{out}(t) = (g_3' - g_3) \cdot V_{of3} \cdot e^{-\alpha t} \qquad (4).$$

2) If the gain of the VGA2 is changed from $g_2$ to $g_2'$:

Because of the high-pass filter 110, the offset of the output of the VGA2 is cut by the filter 110 in a steady state. Then, it is assumed that $g_2$ is changed to $g_2'$. At this moment, the following step-like voltage change $\Delta V_2$ occurs to the input of the high-pass filter 110.

$$\Delta V_2 = (g_2' - g_2) \cdot V_{of2} \qquad (5).$$

This step-like change influences the output $V_{out}$ through two stages of the high-pass filters. A contribution thereof is described using Laplace transform as follows.

$$V_{out(s)} = g_3 \cdot B(s)^2 \cdot \frac{\Delta V_2}{s} = g_3 \cdot \Delta V_2 \cdot \frac{s}{s+\alpha} \cdot \frac{1}{s+\alpha}. \qquad (6)$$

Assuming that $g_2$ is changed at t=0, a time response is obtained as follows:

$$V_{out}(t) = g_3 \cdot \Delta V_2 \cdot (1-\alpha \cdot t) \cdot e^{-\alpha t} = g_3 \cdot (g_2' - g_2) \cdot V_{of2} \cdot (1-\alpha \cdot t) \cdot e^{-\alpha t} \qquad (7).$$

3) If the gain of the VGA1 is changed from $g_1$ to $g_1'$:

Because of the high-pass filter 109, the offset of the output of the VGA1 is blocked by the filter 109 in a steady state. Then, it is assumed that $g_1$ is changed to $g_1'$. At this moment, the following step-like voltage change $\Delta V_1$ occurs to the input of the high-pass filter 109.

$$\Delta V_1 = (g_1' - g_1) \cdot V_{of1} \qquad (8).$$

This step-like change influences the output $V_{out}$ through three stages of the high-pass filters. A contribution thereof is described using Laplace transform as follows.

$$V_{out(s)} = g_3 \cdot g_2 \cdot B(s)^3 \cdot \frac{\Delta V_1}{s} = g_3 \cdot g_2 \cdot \Delta V_1 \cdot \frac{s}{s+\alpha} \cdot \frac{s}{s+\alpha} \cdot \frac{1}{s+\alpha}. \qquad (9)$$

Assuming that $g_1$ is changed at t=0, a time response is obtained as follows.

$$V_{out(t)} = g_3 \cdot g_2 \cdot \Delta V_1 \cdot \left(1 - 2 \cdot \alpha \cdot t + \frac{\alpha^2 \cdot t^2}{2}\right) \cdot e^{-\alpha t} \qquad (10)$$

$$= g_3 \cdot g_2 \cdot (g_1' - g_1) \cdot V_{of1} \cdot \left(1 - 2 \cdot \alpha \cdot t + \frac{\alpha^2 \cdot t^2}{2}\right) \cdot e^{-\alpha t}.$$

FIG. 8 shows the waveform of the mathematical expression (4) if the offset voltage $V_{of3}$ is 1 mV and the gain $g_3$ is changed from 1 time to 16 times as high as the input.

FIG. 9 shows the waveform of the mathematical expression (7) if the offset voltage $V_{of2}$ is 1 mV and the gain $g_3$ is 16 times as high as the input and the gain $g_2$ is changed from 1 time to 16 times as high as the input.

FIG. 10 shows the waveform of the mathematical expression (10) if the offset voltage $V_{of1}$ is 1 mV, the gains $g_3$ and $g_2$ are 16 times as high as the inputs and the gain $g_1$ is changed from 1 time to 16 times as high as the input.

In any case, the 3 dB-cutoff frequency of each high-pass filter is 5 kHz and the value of $\alpha$ is 31415.93.

As is obvious from FIGS. 8 to 10, even if a direct current component can be blocked by the high-pass filters, a high transient voltage occurs to the outputs and deteriorates characteristics by changing the gain of each stage inadvertently.

FIG. 8, for example, shows that if the gain $g_3$ of the VGA3 is changed from 1 time (0 dB) to 16 times (24 dB) as high as the input with the DC offset voltage $V_{of3}$ of 1 mV, a transient voltage pulse of 1 mV×(16−1)=15 mV occurs. FIG. 9 shows that if the gain $g_3$ is 16 times as high as the input (24 dB) and the gain of the VGA2 is changed from 1 time (0 dB) to 16 times (24 dB) as high as the input with the DC offset voltage $V_{of2}$ of 1 mV, a transient voltage pulse of 1 mV×16×(16−1)=240 mV occurs.

Further, FIG. 10 shows that if the gain $g_3$ of the VGA3 is 16 times as high as the input (24 dB), the gain $g_2$ of the VGA2 is 16 times as high as the input (24 dB) and the gain $g_1$ of the VGA1 is changed from 1 time (0 dB) to 16 times (24 dB) as high as the input, a transient voltage pulse of 1 mV×16×16×(16−1)=3840 mV occurs.

It is understood, therefore, that if the gains of a plurality of variable gain amplifiers are changed at random, a high transient voltage occurs to the output even with a low offset voltage. This transient voltage greatly damages the characteristics of the receiver.

As stated above, according to the direct conversion type receiver, it is necessary to control gains almost in a baseband frequency. Therefore, the saturation of amplifiers disadvantageously occurs due to the DC offset which occurs to the respective sections of the baseband circuit. To prevent this, a method for blocking the propagation of a DC component by providing high-pass filters at appropriate places of a circuit may be considered. In this case, however, a transient voltage occurs and deteriorates reception characteristics depending on gain change.

SUMMARY OF THE INVENTION

An object of the present invention is to provide a baseband gain control method and circuit capable of suppressing the generation of a transient voltage in the setting of the gains of a plurality of variable gain amplifiers in a baseband circuit.

The present invention is directed to control a baseband gain by setting gains of a plurality of variable gain amplifiers amplifying a baseband signal and connected to one another in series, to decrease the generation of a voltage due to a transient phenomenon. The settings of the gains of the plurality of variable gain amplifiers in the baseband circuit are controlled as follows:

1. A limitation is set to the quantity of the change of a gain which can be changed at one time. If a gain change exceeding the limiting value is necessary, the gain change is divided into a plurality of quantities of change each equal to or lower than the limiting value and a required gain change is attained while controlling the plurality of quantities of change a plurality of times.
2. If the gain is to be increased, the gains of the variable gain amplifiers starting at the variable gain amplifier close to an input are sequentially increased. If the gain is to be decreased, the gains of the variable gain amplifiers starting at the variable gain amplifier farthest to the input are sequentially decreased.
3. The generation of a transient voltage is suppressed by the gain control by the method of 1 or 2 or the combination of the methods 1 and 2.

According to the present invention, gain control is carried out so that the upper limit of the quantity of the change of the gains of a plurality of variable gain amplifiers for a baseband signal is set. Further, if the gain is to be increased, the gains of the variable gain amplifiers starting at the variable gain amplifier close to an input are sequentially increased. Further, if the gain is to be decreased, the gains of the variable gain amplifiers starting at the variable gain amplifier farthest to the input are sequentially decreased. Thus, it is possible to effectively suppress the generation of a transient voltage caused by a DC offset during the gain control.

The combination of the gain control for providing the upper limit of the quantity of the change of a gain and the distribution control for distributing different gains to a plurality of variable gain amplifiers according to the increase and decrease of the gain enables, in particular, suppressing the generation of a transient voltage caused by a DC offset more effectively.

If the present invention is applied to the gain control of a direct conversion baseband circuit, e.g., the baseband gain control of a direct conversion baseband circuit having a wide dynamic range of a reception signal such as a receiver of a W-CDMA (Wide Band Code Division Multiple Access) type, the present invention exhibits considerably great advantage.

PREFERRED EMBODIMENT OF THE INVENTION

Figure 1:
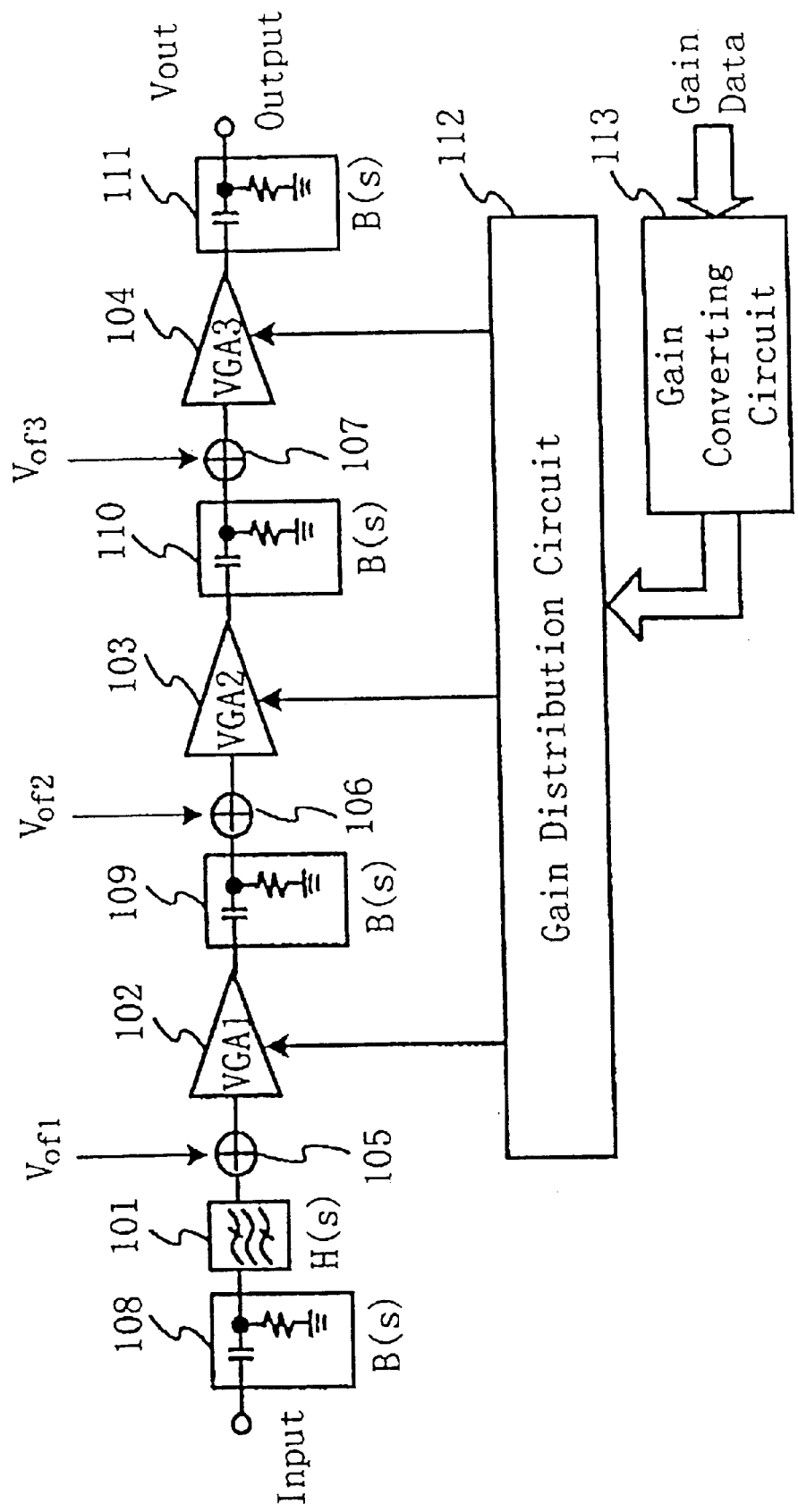
FIG. 1 is a view showing one mode for carrying out a baseband gain control circuit of the present invention.
Figure 7:
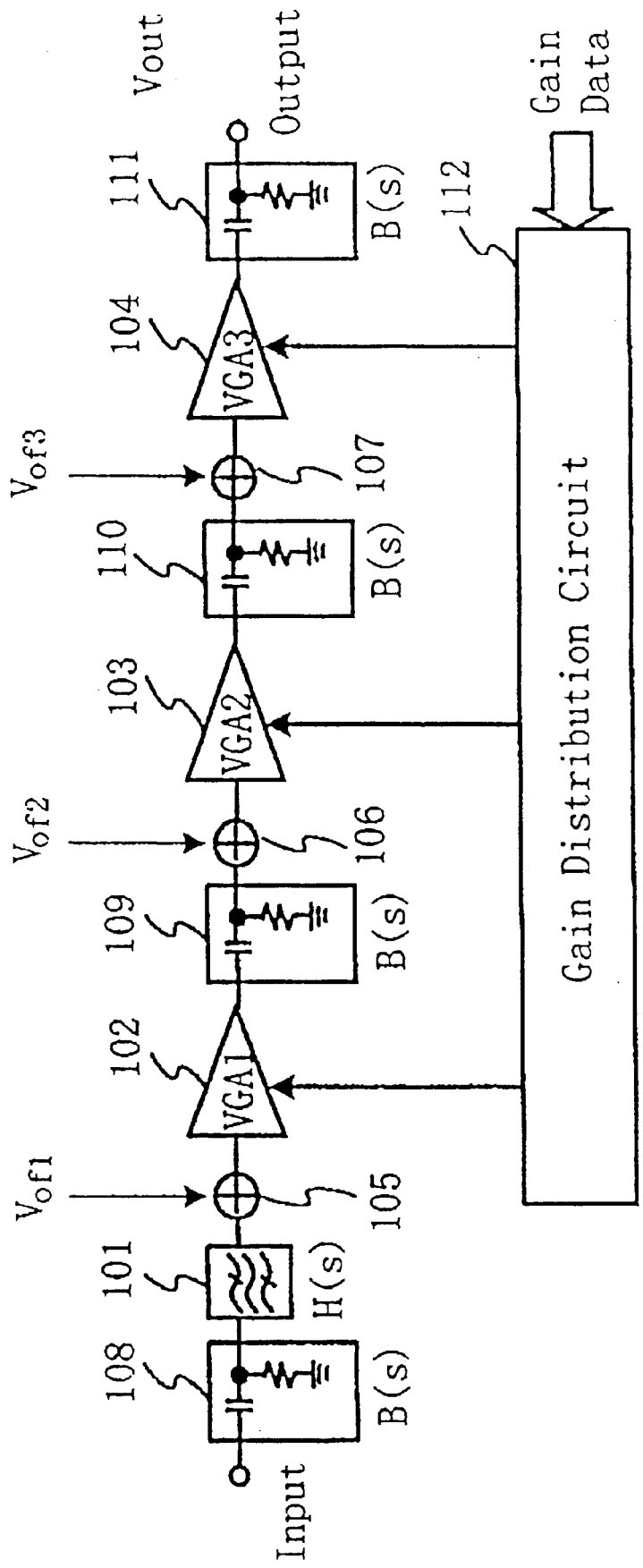
FIG. 7 is a view showing the baseband circuit of the circuit shown in FIG. 6 as a single-end circuit for brevity.

FIG. 1 is a block diagram showing the basic constitution of a baseband gain control circuit of the present invention. A signal path shown therein has, similarly to the conventional circuit shown in FIG. 7, a constitution of the reception signal baseband gain control system of a receiver such as a W-CDMA (Wide Band Code Division Multiple Access) system. The block diagram of FIG. 1 shows a single-end circuit as in the case of the description of the conventional circuit.

(First Mode of the Invention)

The first mode for carrying out the present invention is characterized by comprising a gain distribution circuit 112 and a gain converting circuit 113 as shown in FIG. 1 and in that an upper limit of the gain control is set to the gain control circuit 113.

The gain converting circuit 113 is a circuit converting inputted gain data (Gain Data: corresponding to dB) into gain output data (Gain Output: corresponding to dB) actually set to variable gain amplifiers.

Also, the gain distribution circuit 112 is a circuit having a function of distributing the gain output data inputted from the gain converting circuit 113 to a plurality of variable gain amplifiers as gain control data and controlling the data. In this mode for carrying out the invention, the circuit is constituted so that that the gain output data (Gain Output), either as it is or uniformly amplified/attenuated, is distributed and supplied to a plurality of variable gain amplifiers.

Here, if the Gain Input has a large change, e.g., 48 dB is changed by 24 dB to 72 dB and this change is reflected on the set values of the variable gain amplifiers, respectively, a high transient voltage is generated by a DC offset as already described in detail in "Problems that the Invention is to Solve" part.

Taking this into consideration, in this mode for carrying out the invention, the upper limit or the maximum step of a gain (MAXSTEP) which can be changed once is set. For example, MAXSTEP is set at 2 dB. By setting so, the quantity of the change of a gain of 24 dB is attained from 12 quantities of change each of 2 dB at intervals of pre-determined periods (Pre-Determined Periods). As a result, the generation of a transient voltage can be effectively suppressed.

Figure 8:
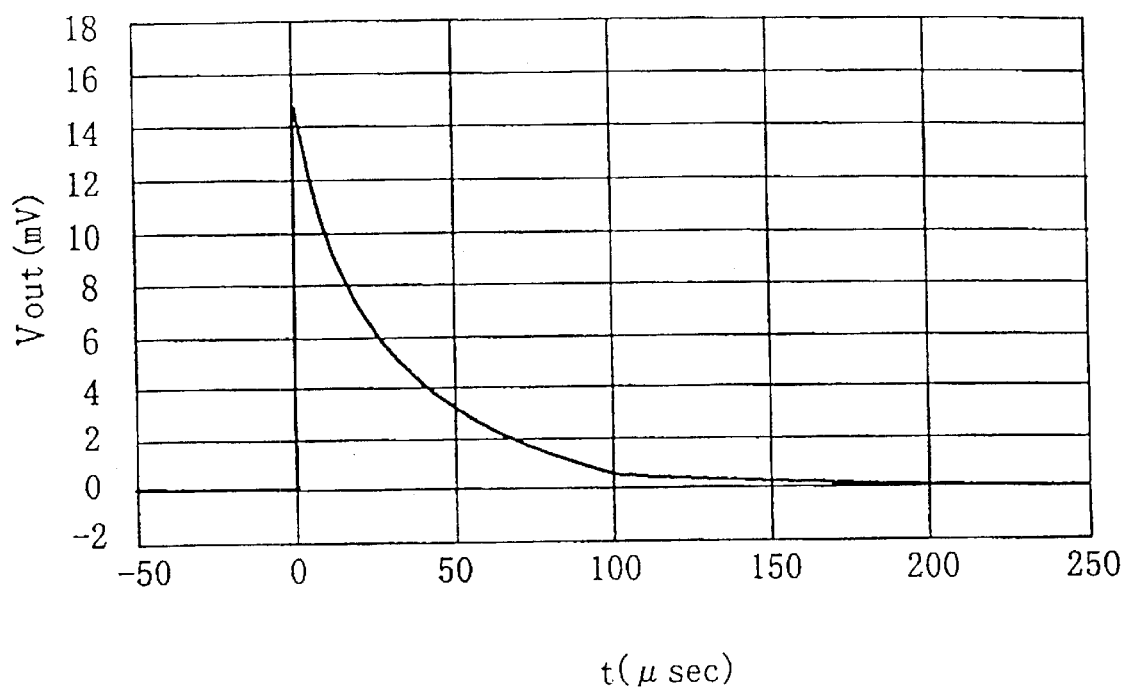
FIG. 8 shows the waveform of an expression (4) if $V_{of3}$ is 1 mV and $g_3$ is changed from 1 time to 16 times as high as an input.
Figure 9:
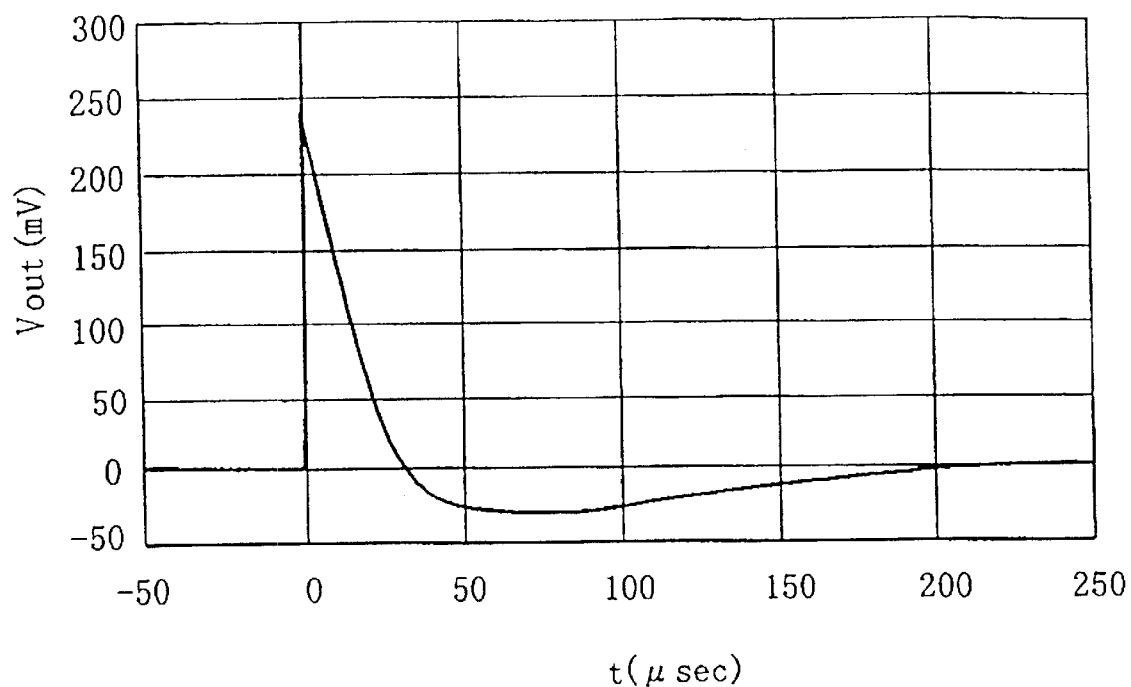
FIG. 9 shows the waveform of an expression (7) if $V_{of2}$ is 1 mV and $g_3$ is 16 times as high as the input and $g_2$ is changed from 1 time to 16 times as high as the input.

For example, FIG. 8 shows the transient voltage if $V_{of3}$ is 1 mV and the gain $g_3$ of the VGA3 is changed from 1 times (0 dB) to 16 times (24 dB) as high as the input. The transient voltage at a peak of 1 mV×(16−1)=15 mV is generated.

If the gain $g_3$ is changed from 22 dB by 2 dB to 24 dB, a voltage X (dBm) at 1 mV and 22 dB can be obtained as 1 mV×$10^{(22/20)}$ from 20 $\log_{10}$X=22 dB. Therefore, to change the gain by 2 dB, it suffices that the voltage is 1 mV×(16−$10^{(22/20)}$)=3.4 mV.

The gain converting circuit 113 outputs such gain output data, as gain set value, to the gain distribution circuit 112 and the gain distribution circuit 112 distributes the gain set value to the respective variable gain amplifiers 102, 103 and 104 either as it is or while amplifying/attenuating the value.

As stated above, the gains of the respective variable gain amplifiers are controlled a plurality of times at intervals of pre-determined periods based on the upper limit of the maximum quantity of change or MAXSTEP, whereby the peak value of a transient voltage can be greatly reduced.

Figure 2:
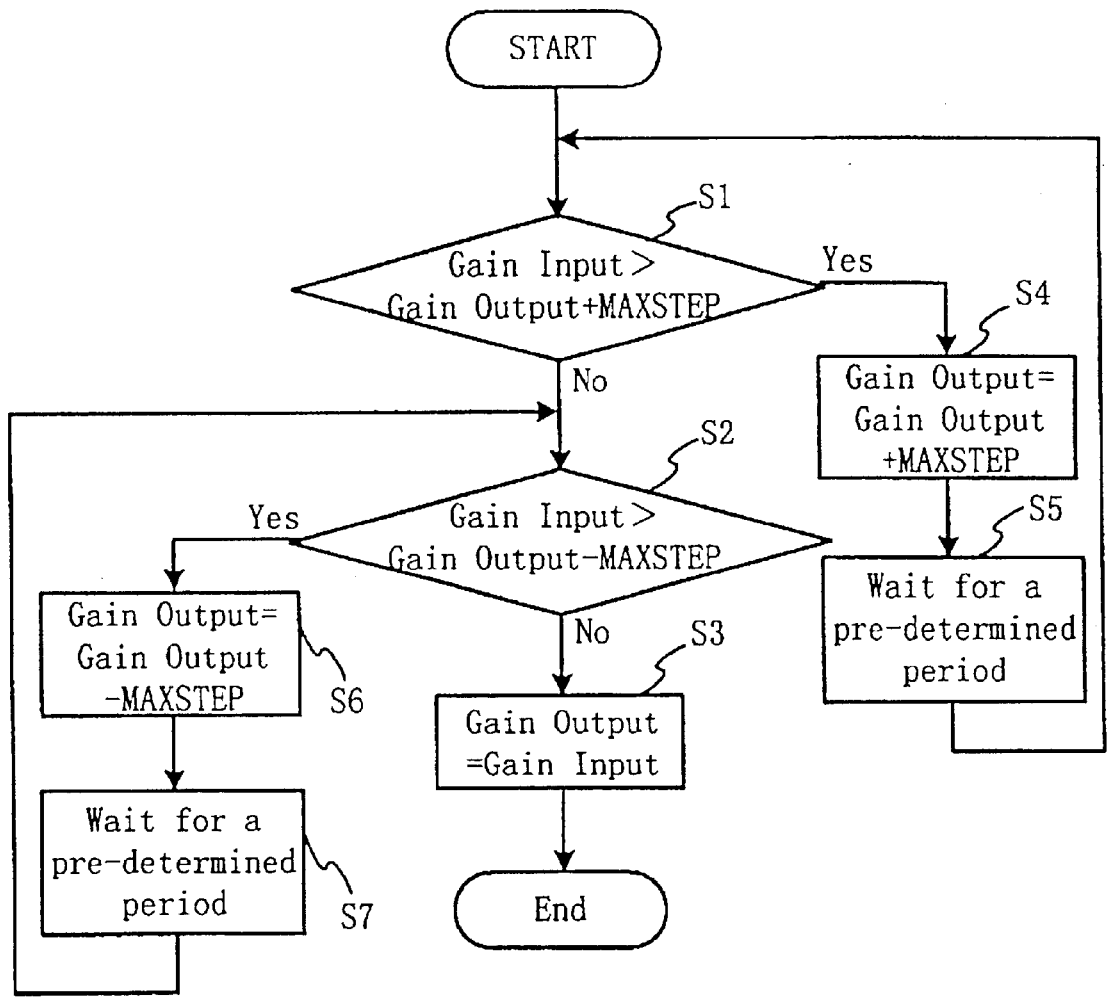
FIG. 2 is a flow chart showing the operation of a gain converting circuit in this mode for carrying out the invention.

FIG. 2 is a flow chart showing the operation of the gain converting circuit 113 in the first mode for carrying out the invention. If the inputted Gain Input value is higher than the Gain Output currently set to the variable gain amplifiers by MAXSTEP dB or more ('YES' in a step s1), then the MAXSTEP dB is added to the currently set Gain Output to obtain a newly set Gain Output (in a step s4). Conversely, if the inputted Gain Input value is lower than the currently set Gain Output by MAXSTEP dB or more ('NO' in the step s1 and 'YES' in the step s2), then MAXSTEP dB is subtracted from the currently set Gain Output to obtain a newly set Gain Output (in a step s6). In the other case ('NO' in the step s1 and 'NO' in the step s2), the currently set Gain Input becomes a newly set Gain Output (in a step s3). This operation is carried out in each pre-determined period (Pre-Determined Period) (in steps s5 and s7) until the Gain Output becomes equal to the Gain Input.

As a result, the quantity of the change of the Gain Output in each pre-determined period is limited to MAXSTEP dB or lower.

It is also possible to determine the maximum number of times for circulating the flow in the flow chart of FIG. 2 so as not to change the Gain Output if the number of times exceed the maximum number.

Figure 3:
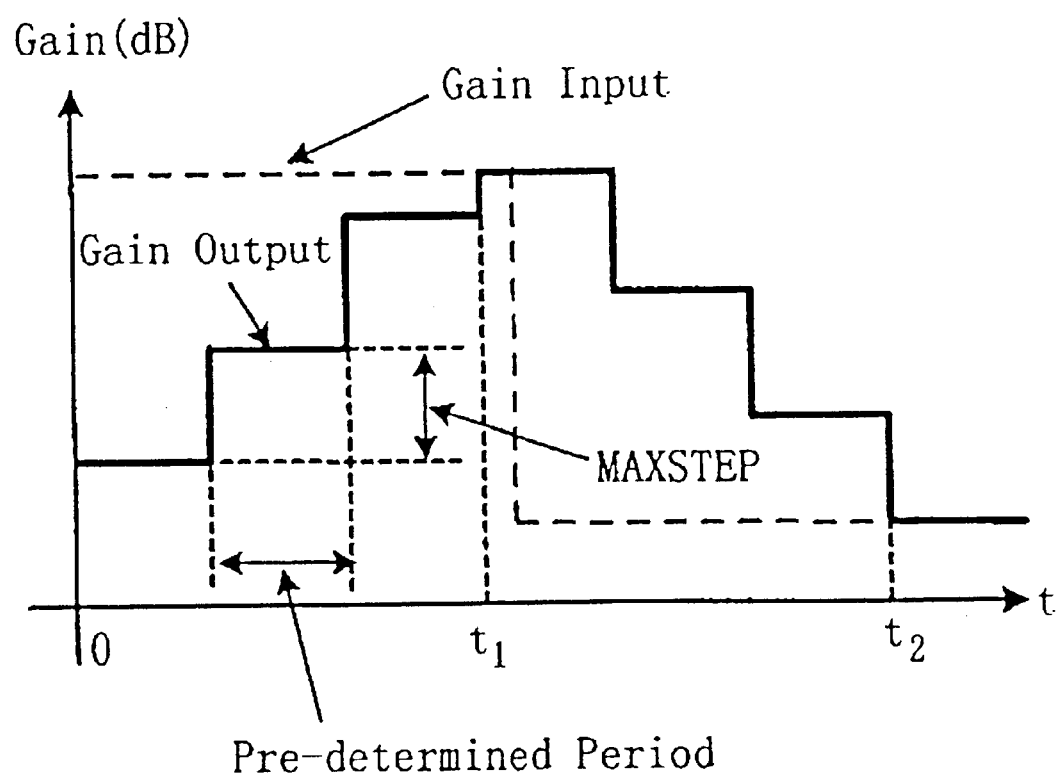
FIG. 3 shows a manner in which the gain of a variable gain amplifier follows gain control data.

FIG. 3 shows a manner in which the Gain Output follows the Gain Input. In the example shown in FIG. 3, the Gain Input greatly increases compared with the Gain Output at a time t=0 and, therefore, the Gain Output increases by MAXSTEP in each Pre-Determined Period. At a time t=t1, the Gain Input and the Gain Output satisfy Gain Input≦Gain Output+MAXSTEP. In this case, they also satisfy Gain Input≧Gain Output−MAXSTEP. Thus, the Gain Output is set to be Gain Input (Gain Output=Gain Input). Thereafter, the Gain Input decreases to lower level, so that after the time t=t1, the Gain Output decreases by MAXSTEP in each Pre-Determined Period and at a time t=t2, the Gain Output is set to be Gain Input (Gain Output=Gain Input).

As can be seen, if the limiting value is set for the quantity of the change of a gain which can be changed once and the change of a gain exceeding the limiting value is controlled, then control is carried out for attaining a required gain change as a plurality of times of changes of the gain each equal to or lower than the limiting value of the gain change. That is, a plurality of quantities of the change of the gain and the quantity of the change of the last gain equal to or lower than the limit value are controlled.

According to the gain control in this mode for carrying out the invention, therefore, even if the Gain Input is greatly changed, the change of a gain is gradually made for a long period of time and the change of the Gain Output can be, therefore, decreased. Due to this, even if there is an offset in a plurality of variable gain amplifiers, it is possible to suppress the generation of a sudden transient voltage.

(Second Mode of the Invention)

In the mode for carrying out the invention stated above, description has been given to a case where the gain distribution circuit 113 uniformly distributes gain control data to a plurality of variable gain amplifiers. It is also possible to greatly suppress the generation of a transient voltage by a distribution method by the gain distribution circuit 113.

In the second mode for carrying out the invention, the gain distribution circuit 112 exercises control so as to supply different gain control data to a plurality of variable gain amplifiers.

Figure 10:
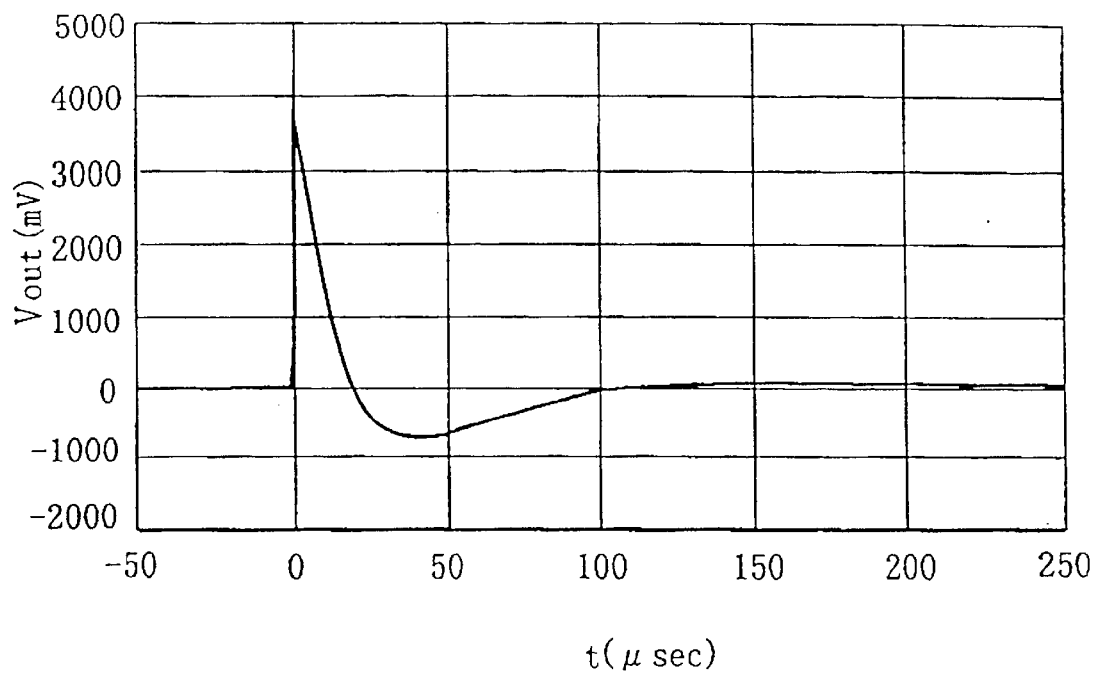
FIG. 10 shows the waveform of an expression (10) if $V_{of1}$ is 1 mV and $g_3$ and $g_2$ are 16 times as high as the input and $g_1$ is changed from 1 time to 16 times as high as the input.

Assume that the gain converting circuit 113 outputs gain data as gain control data as it is. The example shown in FIG. 10, for example, shows the transient voltage if $V_{of1}$ is 1 mV, the gain $g_1$ of the VGA1 is changed from 1 time (i.e., 0 dB) to 16 times (24 dB) as high as the input and the gains $g_3$ and $g_2$ are the maximum gain of 24 dB, respectively. The transient voltage at a peak as high as $$1 \text{ mV} \times (16-1) \times 16 \times 16 = 3840 \text{ mV}$$

is generated.

This is because the gains $g_3$ and $g_2$ are the maximum gain of 24 dB, respectively. To prevent this, the gain distribution circuit distributes a gain as follows.

For example, if the gain of a certain $VGA_X$ is changed, the gains of all the VGA's provided right of the $VGA_X$ are set at a minimum gain, respectively.

According to the example of the present invention, the minimum gain is 0 dB. By so controlling, a transient voltage is limited to $$1 \text{ mV} \times (16-1) \times 1 \times 1 = 15 \text{ mV}.$$

Figure 4:
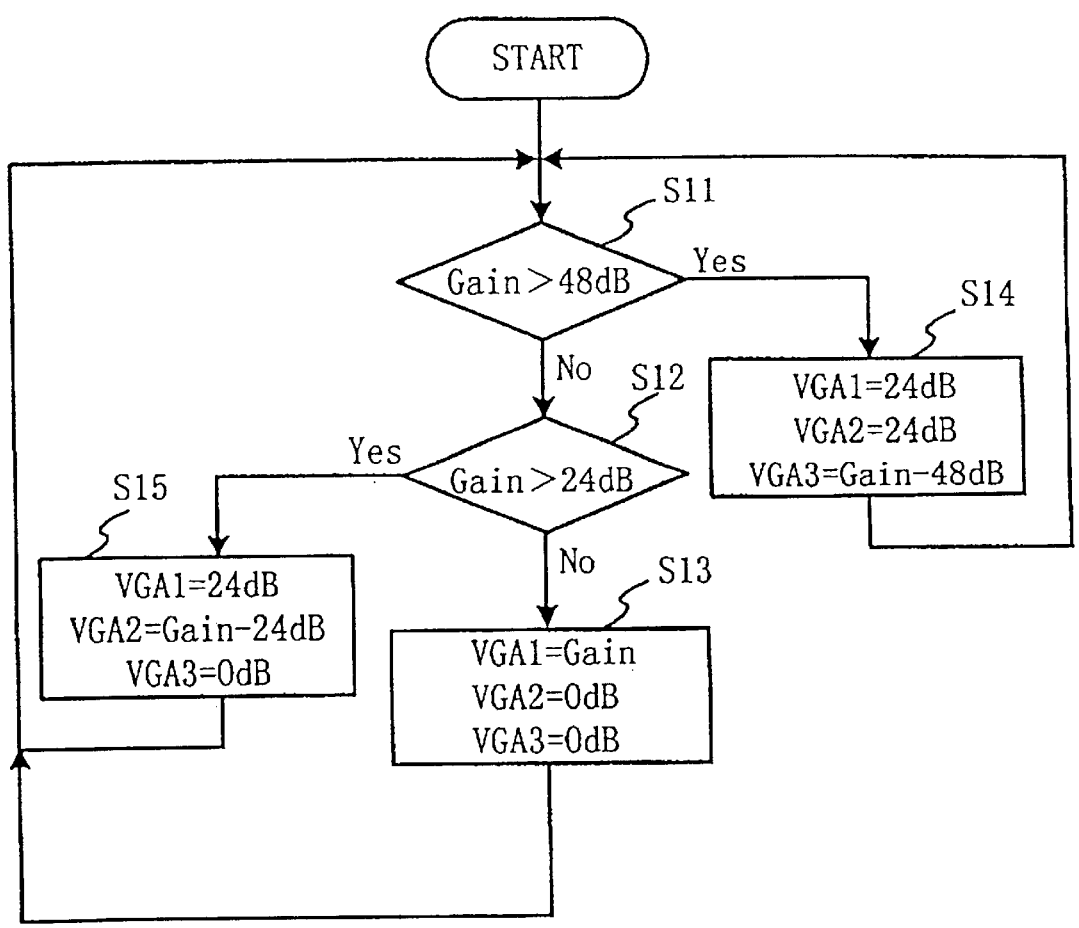
FIG. 4 is a flow chart showing the operation of a gain distribution circuit.

FIG. 4 is a flow chart showing the operation of the gain distribution circuit 112 in the second mode for carrying out the invention. In the control conducted by the gain distribution circuit 112 in this mode for carrying out the invention, a control algorithm that the gains of variable gain amplifiers starting at a variable gain amplifier close to an input are sequentially increased and that, if the gain is decreased, the gains of variable gain amplifiers starting at a variable gain amplifier farthest to the input are sequentially decreased is utilized. The gain distribution circuit 112 exercises control so that the maximum value of the amplification gains of the variable gain amplifiers in this mode becomes, for example, 24 dB, threshold values are set at 24 dB and 48 dB for the input gain data (Gain) of the gain distribution circuit and that the respective variable gain amplifiers have different gains according to the state of the input gain data.

In a step s11, it is judged whether or not the Gain inputted to the gain distribution circuit 112 is higher than 48 dB. If the Gain is higher than 48 dB, then the VGA1, VGA2 and VGA 3 are set at 24 dB, 24 dB and (Gain−48 dB), respectively and the operation returns to the step s11. If it is judged that the Gain is equal to or lower than 48 dB in the step s11, it is then judged whether or not the Gain is higher than 24 dB in a step s12. If the Gain is higher than 24 dB, then the VGA1, VGA2 and VGA3 are set at 24 dB, (Gain−24 dB) and 0 dB, respectively and the operation returns to the processing of the step s11. If the Gain is lower than 24 dB, then the VGA1, VGA2 and VGA3 are set at Gain, 0 dB and 0 dB, respectively and the operation returns to the processing of the step s11.

If gain is distributed to the VGA1, VGA2 and VGA3 as the respective gain control data of a plurality of variable gain control amplifiers as shown in FIG. 4 and a certain VGA is changed, data is controlled so that the gains of the VGA's on the output side relative to the certain VGA become a minimum gain, respectively.

In the examples of gain distribution to the VGA1, VGA2 and VGA3 in this mode for carrying out the invention, the gain distribution circuit exercises control based on the control algorithm that if the gain control data from the gain converting circuit 113 or Gain is high (higher than the threshold value of 48 dB), the gains of the VGA1 and the VGA2 closer to an input are increased to 24 dB and the gain of the VGA3 is the remaining gain of (Gain−48 dB) to satisfy VGA1, VGA2>VGA3, that if the Gain is an intermediate (higher than the threshold value of 24 dB and equal to or lower than the threshold value of 48 dB), the VGA1, VGA2 and VGA3 are set to satisfy VGA1 (=24 dB)>VGA2 (=Gain−24 dB)>VGA3 (=0 dB) and that if the Gain is low (lower than 24 dB), the VGA1, VGA2 and VGA3 are set to satisfy VGA1 (=Gain)>VGA2 (=0 dB), VGA3 (=0 dB). In short, if the gain is to be increased, the gains of variable gain amplifiers starting from the variable gain amplifier close to an input are sequentially increased. If the gain is to be decreased, those of variable gain amplifiers starting from the variable gain amplifier farthest to the input are sequentially decreased.

(Third Mode of the Invention)

As a mode for carrying out the invention for suppressing a transient voltage more effectively in the gain control of the present invention, the first mode and the second mode for carrying out the invention are combined. A combination of gain control while setting an upper limit for the quantity of gain change and distribution control for distributing different gains to a plurality of variable gain amplifiers according to the increase and decrease of the gain are conducted, thereby making it possible to realize the effect of suppressing a transient voltage in a multiplied manner.

In this mode for carrying out the invention, a gain converting circuit 113 is constituted to carry out an operation with a maximum step provided at the circuit 113 as in the case of the first mode for carrying out the invention. A gain distribution circuit 112 is constituted to distribute gain control data as in the case of the second mode for carrying out the invention.

While a transient voltage is suppressed down to 1 mV×(16−1)×1×1=15 mV in the second mode for carrying out the invention, a transient voltage can be further decreased to $$1\ mV\times(16-10^{(22/20)})\times1\times1=3.4\ mV$$

in this mode for carrying out the invention.

While description has been given using flow charts so far, the function of the flow charts can be realized by a hardware by describing the function as it is with a functional description language such as VHDL.

(Another Mode of the Invention)

As another mode for carrying out the present invention, a gain distribution circuit 112 can be constituted out of an ROM while the basic constitution of the circuit is the same as those described above.

Figure 5:
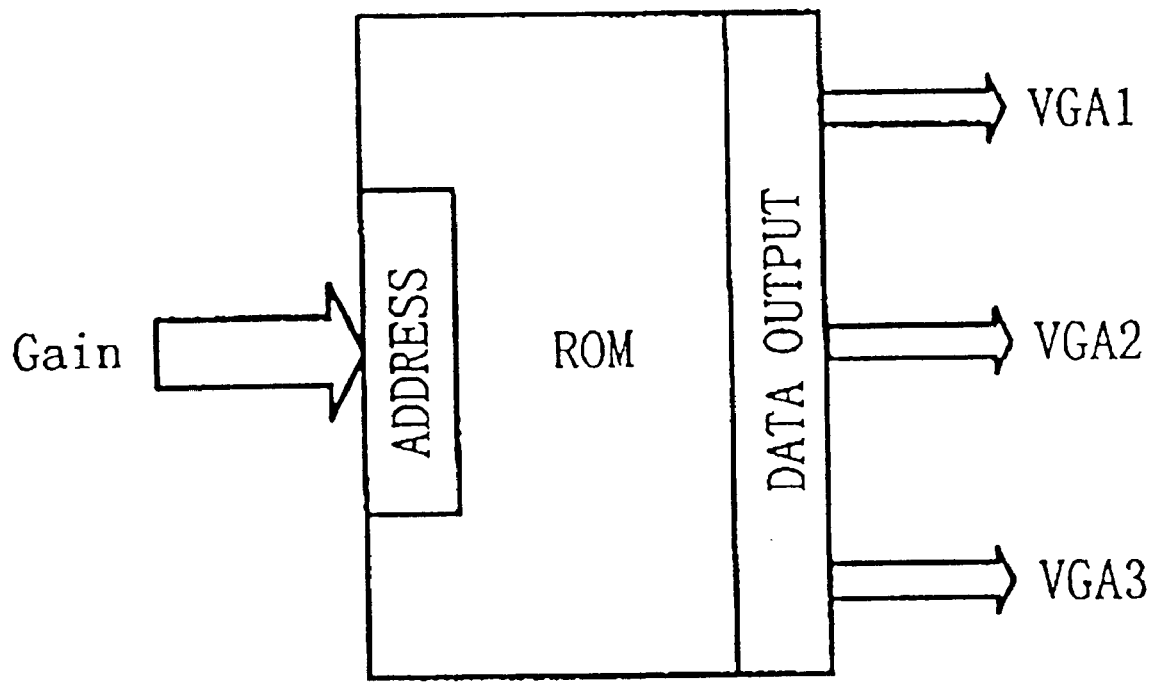
FIG. 5 is a view showing an example in which the gain distribution circuit is constituted out of an ROM.
Figure 6:
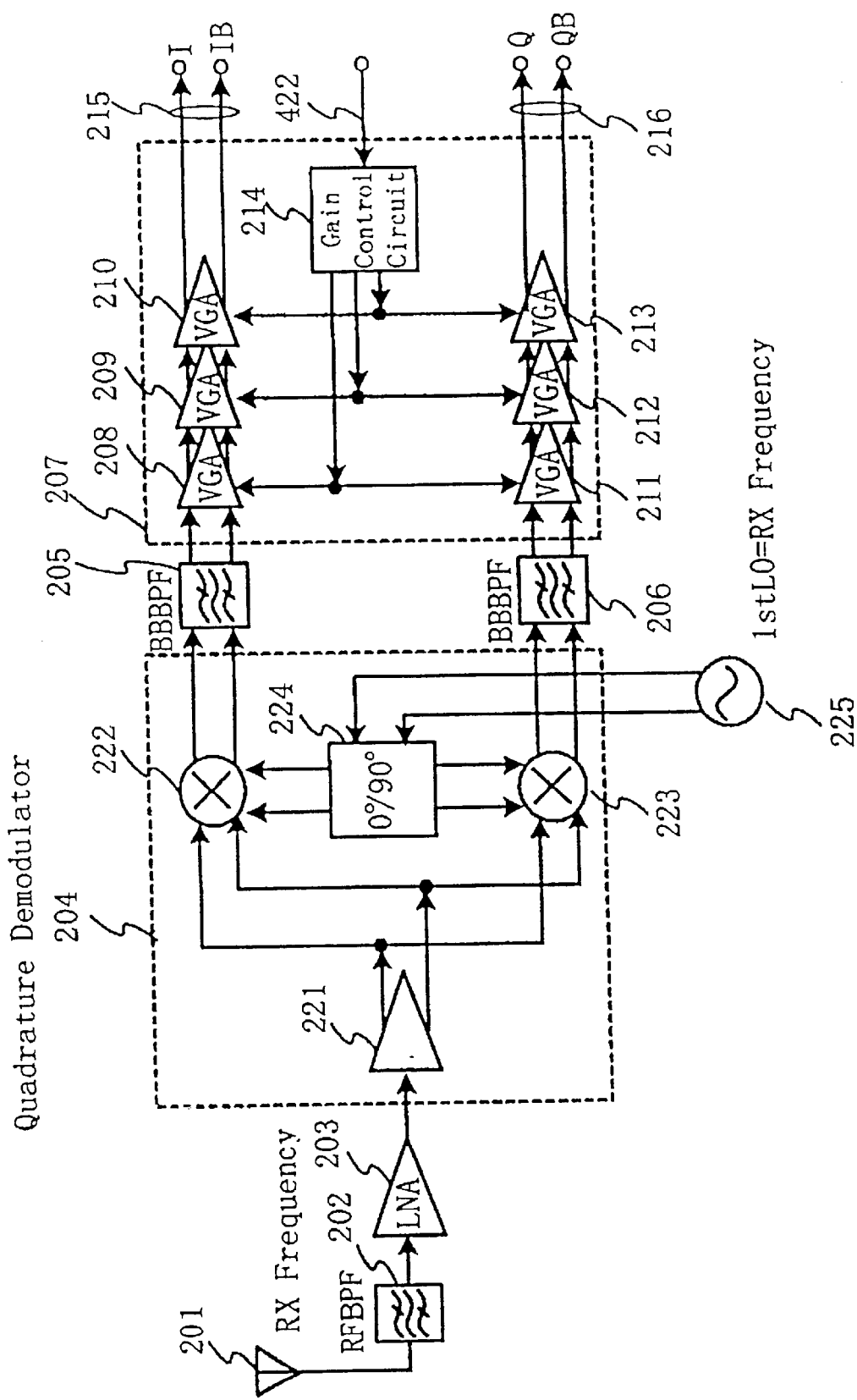
FIG. 6 is a view showing the constitution of a conventional direct conversion receiver.

FIG. 5 shows an example in which the gain distribution circuit is constituted out of an ROM. As shown in FIG. 5, while a gain set value from a gain converting circuit 113 is set as an address input, the gains of respective variable gain amplifiers corresponding to the address input are read from the ROM and thereby set. Data written to the ROM is pre-determined so as to satisfy the algorithm of FIG. 4, whereby the gain distribution circuit can operate in the same manner as that in the preceding modes for carrying out the invention.

What is claimed is:

1. A gain control method for maintaining a total amplifying gain of an output from a baseband amplifier including series-connected variable gain amplifiers (VGAs), by using a prescribed gain limit and a prescribed time period, which comprising the steps of:

fixing a prescribed gain for said output from said baseband amplifyier;

comparing said total amplifying gain with said prescribed gain;

adding said prescribed gain limit to said prescribed gain when said total amplifying gain is higher than said prescribed gain by said prescribed gain limit or more, or subtracting said prescribed gain limit from said prescribed gain when said total amplifying gain is lower than said prescribed gain by said prescribed gain limit or more; and repeating the adding step or the subtracting step until said total amplifying gain becomes equal to said prescribed gain.

2. The gain control method according to claim 1, wherein the repeating step is limited to a prescribed number.

3. The gain control method according to claim 1, wherein said prescribed gain is distributed in such a manner that the gains of said VGAs are increased in serial order from the input to the output of said baseband amplifier when said total amplifying gain is to be increased, while the gains of the VGAs are decreased in serial order from the output to the input of said baseband amplifier when said total amplifying gain is to be decreased.

4. A gain control method for maintaining a total amplifying gain of an output from a baseband amplifier including series-connected variable gain amplifiers (VGAs), by using a prescribed gain limit and a prescribed time period, which comprising the steps of:

fixing a prescribed gain for said output from said baseband amplifyier;

comparing said total amplifying gain with said prescribed gain;

distributing said prescribed gain in such a manner that the gains of said VGAs are increased in serial order from the input to the output of said baseband amplifier when said total amplifying gain is to be increased, while the gains of the VGAs are decreased in serial order from the output to the input of said baseband amplifier when said total amplifying gain is to be decreased.

5. A baseband amplifier including series-connected variable gain amplifiers (VGA) for maintaining a total amplifying gain, which comprises:

a gain converting circuit for fixing a prescribed gain for the output from said baseband amplifier; for comparing said total amplifying gain with said prescribed gain; for adding a prescribed gain limit to said prescribed gain when said total amplifying gain is higher than said prescribed gain by said prescribed gain limit or more, or subtracting said prescribed gain limit from said prescribed gain when said total amplifying gain is lower than said prescribed gain by said prescribed gain limit or more; and for repeating the adding step or the subtracting step until said total amplifying gain becomes equal to said prescribed gain; and a gain distribution circuit for distributing the output from said gain converting circuit.

6. The baseband amplifier according to claim 5, wherein said output from said gain converting circuit is equally distributed to said VGAs.

7. The baseband amplifier according to claim 5, wherein the repeating step is limited to a prescribed number.

8. The baseband amplifier according to claim 5, wherein said gain distribution circuit distributes said prescribed gain in such a manner that the gains of said VGAs are increased in serial order from the input to the output of said baseband amplifier when said total amplifying gain is to be increased, while the gains of the VGAs are decreased in serial order from the output to the input of said baseband amplifier when said total amplifying gain is to be decreased.

9. A baseband amplifier including series-connected variable gain amplifiers (VGA) for maintaining a total amplifying gain, which comprises:

a gain converting circuit for fixing a prescribed gain for the output from said baseband amplifyier and for comparing said total amplifying gain with said prescribed gain; and a gain distribution circuit for distributing said prescribed gain in such a manner that the gains of said VGAs are increased in serial order from the input to the output of said baseband amplifier when said total amplifying gain is to be increased, while the gains of the VGAs are decreased in serial order from the output to the input of said baseband amplifier when said total amplifying gain is to be decreased.

* * * * *